US 6,672,500 B2

(12) United States Patent
Caletka et al.

(10) Patent No.: US 6,672,500 B2
(45) Date of Patent: *Jan. 6, 2004

(54) METHOD FOR PRODUCING A RELIABLE SOLDER JOINT INTERCONNECTION

(75) Inventors: David V. Caletka, Apalachin, NY (US); Kevin Knadle, Vestal, NY (US); Charles G. Woychik, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 93 days.

This patent is subject to a terminal disclaimer.

(21) Appl. No.: 09/801,948

(22) Filed: Mar. 7, 2001

(65) Prior Publication Data
US 2001/0045445 A1 Nov. 29, 2001

Related U.S. Application Data

(60) Continuation-in-part of application No. 09/649,318, filed on Aug. 28, 2000, now Pat. No. 6,293,455, which is a division of application No. 09/104,746, filed on Jun. 25, 1998, now Pat. No. 6,138,893.

(51) Int. Cl.⁷ ............................ B23K 31/12; B23K 31/00
(52) U.S. Cl. ..................... 228/103; 228/102; 228/180.1; 228/180.4; 228/180.22
(58) Field of Search ................................ 228/102, 103, 228/104, 180.1, 180.21, 180.22

(56) References Cited

U.S. PATENT DOCUMENTS

| 4,076,165 A | 2/1978 | Latasiewicz et al. ........ 228/136 |
| 4,159,506 A | 6/1979 | Latasiewicz et al. ........ 361/299 |
| 4,180,199 A | 12/1979 | O'Rourke et al. .......... 228/102 |
| 4,224,744 A | * 9/1980 | Siegel et al. ................ 174/263 |
| 4,742,950 A | 5/1988 | Neitz ........................ 228/240 |
| 4,775,776 A | 10/1988 | Rahn et al. ................. 219/388 |
| 4,909,430 A | 3/1990 | Yokota ....................... 228/102 |
| 4,938,410 A | 7/1990 | Kondo .................... 228/180.1 |
| 5,180,440 A | * 1/1993 | Siegel et al. ................ 136/200 |
| 5,232,145 A | 8/1993 | Alley et al. ................. 228/102 |
| 5,413,164 A | 5/1995 | Teshima et al. ........... 165/11.1 |
| 5,433,368 A | 7/1995 | Spigarelli ....................... 228/8 |
| 5,435,482 A | 7/1995 | Variot et al. ................ 228/254 |
| 5,439,160 A | * 8/1995 | Marcantonio ............... 228/102 |
| 5,562,243 A | 10/1996 | Marcantonio ................... 228/8 |
| 5,573,688 A | 11/1996 | Chanasyk et al. .......... 219/388 |
| 5,601,364 A | * 2/1997 | Ume ...................... 250/237 G |
| 5,629,578 A | 5/1997 | Winzer et al. .............. 310/334 |
| 5,630,667 A | 5/1997 | Ito ............................... 374/57 |
| 5,647,667 A | 7/1997 | Bast et al. ...................... 374/57 |
| 5,767,424 A | * 6/1998 | Breunsbach et al. ..... 228/180.1 |
| 5,971,249 A | * 10/1999 | Berkin ....................... 228/102 |
| 6,138,893 A | * 10/2000 | Caletka et al. ............. 228/102 |
| 6,293,455 B1 | * 9/2001 | Caletka et al. ............. 228/102 |
| 6,402,372 B1 | * 6/2002 | Saunders .................... 136/230 |

* cited by examiner

Primary Examiner—L. Edmondson
(74) Attorney, Agent, or Firm—William H. Steinberg

(57) ABSTRACT

A method and an arrangement for measuring the cooling rate and temperature differential between the top and bottom surfaces of a printed circuit board. The method is intended to facilitate control over the temperature differential which is encountered between the top and bottom of the printed circuit board so as to prevent warpage thereof during the formation of solder joints in a reflow solder oven.

20 Claims, 4 Drawing Sheets

\* TOP THERMOCOUPLE 38 FOR MEASURING T(TOP) ~ T(SOLDER). PLACED INTO HOLE (OR PROXIMATE THE HOLE) TOUCHING SOLDER AND SECURED WITH EPOXY.

X BOTTOM THERMOCOUPLE 34 FOR MEASURING T(BOTTOM). PLACED ON BOTTOM SURFACE OF BOARD PROXIMATE THE DRILLED HOLE AND SECURED WITH EPOXY.

\# TOP 38' AND BOTTOM 34' THERMOCOUPLES EPOXIED ON BOARD SURFACES AT LOCATIONS AWAY FROM MODULE POSITIONS (I.E. BOARD LEADING EDGE, BOARD TRAILING EDGE, ETC).

✷ TOP THERMOCOUPLE 38 FOR MEASURING T(TOP) ~ T(SOLDER).
  PLACED INTO HOLE (OR PROXIMATE THE HOLE) TOUCHING
  SOLDER AND SECURED WITH EPOXY.

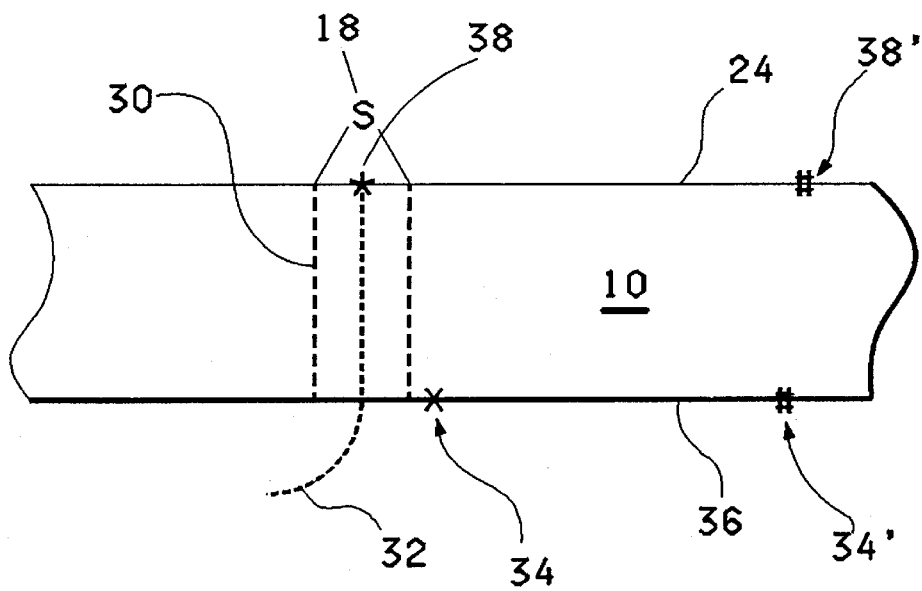

X BOTTOM THERMOCOUPLE 34 FOR MEASURING T(BOTTOM).
  PLACED ON BOTTOM SURFACE OF BOARD PROXIMATE
  THE DRILLED HOLE AND SECURED WITH EPOXY.

TOP 38' AND BOTTOM 34' THERMOCOUPLES EPOXIED ON
  BOARD SURFACES AT LOCATIONS AWAY FROM MODULE
  POSITIONS (I.E. BOARD LEADING EDGE, BOARD
  TRAILING EDGE, ETC).

FIG. 2

METHOD FOR PRODUCING A RELIABLE SOLDER JOINT INTERCONNECTION

CROSS REFERENCE TO APPLICATIONS

This application is a continuation-in-part of Ser. No. 09/649,318, filed Aug. 28, 2000 now U.S. Pat. No. 6,293,455B1, which is a divisional application of Ser. No. 09/104,746, filed Jun. 25, 1998, now U.S. Pat. No. 6,138,893.

FIELD OF THE INVENTION

The present invention relates to a method and to an arrangement for measuring the cooling rate and thermal differential between the top and bottom of a printed circuit board (PCB). As defined, the invention is intended to facilitate control over the temperature differential which is encountered between the top and bottom of the PCB so as to prevent warpage thereof during the formation of component/module solder joints or fillets.

BACKGROUND OF THE INVENTION

In the implementation of soldering procedures, for example, in reflow soldering ovens, which are employed in the soldering of high-mass PCBs, particularly when these PCBs are equipped with high-mass ceramic column grid array (CCGA) or ceramic ball grid array (CBGA) modules, there have been ascertained unique types of solder joint failures which are encountered in the formation of the module solder joints for producing electrical interconnections, and which are frequently referred to as solidification stress fractures. There are three types of failure mechanisms that can result;

(a) Solidification fractures, time-zero fails or reliability exposure (any solder fillet).
(b) Stretched or disturbed joints, reliability exposure (any solder fillet).
(c) Brittle cracked columns, time-zero fails or reliability exposure (Solder column modules only).

These modes of solder joint failure have been investigated in the technology, and shown to be highly dependent upon the cooling rate and thermal gradient extending through the thickness of the printed circuit board during corner solder joint or fillet solidification. An aspect which has been ascertained in cases of stress fracture solder joint failure has been the occurrence of a clean fracture which is produced between the intermetallic copper-tin (Cu—Sn) material on the circuit board solder joint pad and the solder material which is in the solder joint or fillet. The result of the foregoing can be either an almost immediate time-zero (instantaneous) open electrical interconnection, or a latent reliability fail which necessitates temperature cycling in order to become electrically open. The time-zero opens are characterized by gaps of up to 1 mil (0.001 inches), which may occur on only a single solder joint or fillet which is surrounded by a large number of so-called "stretched" solder joints. The reliability failures may be separated through less than 100% of the soldered cross sectional area and do not evidence any measurable gap until failure during temperature cycling.

In essence, when a thermocoupled profile card is conducted or conveyed, such as on a belt or conveyor, through a reflow oven, for instance, an infrared (IR)/convection oven which is known to produce stress fracture interconnections, there has been indicated the presence of a sharp transient thermal differential spike between the top and bottom surfaces of the profile card, when thermocouple data is collected and plotted/analyzed as prescribed herein. This particular temperature differential spike is believed to be responsible for inducing printed circuit board warpage at a period in time when module solder joints or fillets especially at a corner and periphery of the module, are at the verge of solidification, thereby resulting in the type of failure mode previously described on nearby solder joints shortly after solidification.

For example, in cases where a pull test wire is soldered to a CCGA solder joint pad on a PCB, and shortly after solidification, it has been ascertained that the solder joint strength is extremely low; for example, approaching only a few grams. Moreover, from modeling studies, there has been indicated a variation in board warpage, which may be on the order of 1 mil. Thus, when these experimental observations are combined, this can readily result in an occurrence of stress fracture types of solder joint failure.

Another aspect of these particular solder joint failures which may not be readily apparent after assembly of the PCB components or modules, resides in the application of PCB deformation during solder joint solidification in effect, warping of the PCB during solder joint solidification, can readily weaken any resulting electrical interconnection solder joint or fillet of the components or modules.

The process causing solder joint failure and related influencing factors are essentially as follows:

1. The temperature differential between the top surface and bottom surface of the PCB ($\Delta T_z = T_{top} - T_{bot}$) which is created extending through the thickness of the PCB (the Z-axis) during the cooling segment of the conveyor belt or rail driven oven reflow cycle. The temperature on the top surface of the printed circuit board can be significantly higher or lower than that on the bottom surface, depending on which surface cools more rapidly. One surface may cool faster than the other due to oven factors (forced air rate/volume/temperature, belt effects, etc.) and product attributes (component density and thermal mass). Thus, the magnitude of this Z-axis thermal differential is a function of (a) PCB thickness inasmuch as thicker boards can withstand a larger temperature difference between the top or upper surface and the bottom surface.
(b) The mass, density and placement of components or modules on the top surface of the printed circuit board whereby the greater mass and density retains more heat on the top side or upper surface in comparison with the bottom side or surface.
(c) Cool-down rate wherein higher cooling rates exaggerate the instantaneous temperature differential between the top or upper and the bottom surfaces of the printed circuit board.
(d) The employment of direct impingement fans in order to cool the top and/or bottom PCB surfaces whereby one surface is cooled significantly faster than the other (instantaneously or during the entire cool down period) due to differences in
  (1) Design and use of top versus bottom fans, staggered location of top/bottom fans, differences in airflow, and balanced use (some ovens have fans only on one side or the other).
  (2) Design and use of oven belt or work board holder on which the PCB is placed, which can impede airflow more from one side than the other.
  (3) Layout of components or modules on PCB top and/or bottom surface, which can also impede airflow locally across the PCB.

2. Differential thermal expansion between top and bottom board surfaces due to Z-axis temperature differential causes the printed circuit board to warp practically instantaneously, thereby imparting a load or stress on some of the component/module solder joints assembled thereon.

In the case of a positive $\Delta T_z$ or change in the positive direction, the top side or upper surface of the printed circuit board expands at a greater rate than the bottom surface, causing the PCB to warp or bend concavely downwardly. In effect, below a module or component site, the PCB moves away from the module or component to the greatest extent at corner and edge solder joints.

3. The instantaneous warping of the printed circuit board with respect to the modules or components which are positioned thereon creates a displacement and a resultant load which can readily produce a disturbed or fractured solder joint or fillet, depending upon the timing and the temperature of the solder joints. This can occur in solder columns, balls, or fillets when the temperature range of the solder is from about (T1+10 degrees Celsius)>T2>(T1−25 degrees Celsius) where T2 is defined as the instantaneous temperature of the solder joint and T1 is the solidification point of the solder joint upon cooling. The larger temperature range specified below T2 is intended to account for a phenomenon known as undercooling.

The result of the foregoing can be a time-zero electrical opening of the solder joints or fillets, and/or early life cycle reliability failures during thermal cycling.

Although considerations have been given in the technology towards improving the reliability of component or module solder joints on printed circuit boards, and particularly in monitoring and possibly regulating encountered temperature differentials as the printed circuits boards are conveyed through infrared ovens or solder reflow ovens on conveyor belts, transport rails or the like, these generally do not readily provide for simple remedial methods, measures, and arrangements which enable correction of the temperature differential spike problems which are encountered during soldering sequences and which cause PCB warping and resultant component or module solder joint failures or early life cycle reliability failures during thermal cycling.

Bast et al., U.S. Pat. No. 5,647,667 discloses an arrangement for the proof testing of ceramic parts. Utilized is an acceptance stress test in which a stress is generated by a temperature distribution on a part through thermal radiation. The stress is then characterized in order to validate the test.

Although the temperature distribution is characterized similarly to the process employed in the present invention as between various component regions, there is no teaching of a method and algorithm for the profiling of a printed circuit board transported through a reflow solder oven in order to obtain results which will be indicative of any temperature differential spikes tending to warp a PCB and adversely affect the integrity of solder joints and electrical connects.

Ume, U.S. Pat. No. 5,601,364 discloses a method and apparatus for measuring thermal warpage including a test setup and apparatus for producing shadow moire measurements on printed circuit boards over a given time interval and temperature profile. The temperature profile obtained thereby is a highly simplified simulation of an actual reflow oven, such as is obtained from typical oven profile cards. Although, the patent evaluates printed circuit board warpage for a desired temperature profile over a period of time, there is no disclosure of positioning thermocouples in a unique manner on opposite surfaces of a printed circuit board for detecting specific failure mechanisms, nor is the thermal differential ($\Delta t_z$) between the top and bottom surfaces of the PCB ascertained.

Ito, U.S. Pat. No. 5,630,667 merely discloses a modeling method for predicting heat cracking through a three-dimensional polymer model constituted of photo-set resins having a particular thermal conductivity in order to identify hot spots which may be susceptible to heat cracking; for example, such as exhaust manifolds.

Marcantonio, U.S. Pat. No. 5,562,243 discloses a method and apparatus for reflow temperature settings, in which an artificial network provides for the reflow oven settings for acceptable soldering of printed circuit boards based on inputted thermal/physical features and feedback "learning". There is no disclosure of the utilization of thermocouples on opposite PCB surfaces for detecting specific failure mechanisms when measuring temperature differential between the top and bottom surfaces of the printed circuit board.

Similarly, O'Rourke, et al., U.S. Pat. No. 4,180,199 also merely describes a mass soldering system for measuring temperature as a function of time through a wave soldering process, and does not direct itself to a method and arrangement pursuant to the present invention.

SUMMARY OF THE INVENTION

Accordingly, pursuant to the present invention, in order to be able to utilize a thermal profile card representative of a PCB, which will measure the cooling rate and the Z-thermal differential of the card, the localized temperature differential between the top and bottom surfaces of the card during a specific time interval is measured by a thermocouple pair while the module or component solder joints assembled thereon are solidifying. This is accomplished by providing the thermocouple pair at both the top and bottom surface of the thermal profile card at all critical points on the profile card, such as at the diagonal corner solder joints of the module or component assembled thereon, the center solder joint of the module or component, a leading edge of the card at three points, and a trailing edge of the card at three points and the center line of the card at three points, between the leading and trailing edges.

A recommended profile has to ensure that there is an absence of a significant change in temperature differential of the thermocoupled sensing pairs or thermocouples during the critical cooling period, as defined by thermocouple pairs located at or proximate module solder joints, when the thermal profile card is conveyed through the cooling segment of the reflow solder oven, whereby there will be substantially no encountered thermal profile card warpage while the solidifying solder joints are susceptible to fracture.

For example, examples of acceptable limits for $\Delta T_z$ include, but are not limited to:

1. average magnitude of $\Delta T_z$ of all pairs of thermocouples is in the range of about 0–12 degrees Celsius (° C.).
2. No single magnitude of $\Delta T_z$ is greater than about 10° C.
3. No single change in the magnitude of $\Delta T_z$ is greater than about 10° C.

As previously described, it has become known that solidified solder joint or fillet strength is extremely weak at temperatures slightly below solidification temperature. Based on testing, a critical cooling period occurs when the temperature of the solder joints, for example solder columns, balls, or fillets, is from about (T1+10 degrees Celsius)>T2>(T1−25 degrees Celsius). In view thereof, it is desired to eliminate any thermal differential spike which translates into a high Z-thermal differential and therefore profile card or PCB warpage, when the solder joints are within the range of about (T1+10 degrees Celsius)>T2>(T1−25 degrees Celsius).

Accordingly, it is an object of the present invention to provide an arrangement for producing reliable component/module ball grid array (BGA) or column grid array (CGA) solder joint interconnections.

It is another object of the present invention to provide a method of utilizing a thermal profile card which will measure and simulate the cooling rate and the $\Delta T_z$ between the top and bottom surfaces of a printed circuit board during the time interval while component or module corner solder joints are solidifying.

A more specific object of the present invention resides in providing an arrangement for measuring the cooling and Z-thermal differential through the utilization of thermocoupling the top surface and bottom surface of a printed circuit profile card so as to be able to compensate for temperature variations in a reflow solder oven and to thereby be able to avoid substantial temperature differential spikes.

According to one aspect of the invention there is provided a method for measuring the cooling rate and temperature differential between a top surface and a bottom surface of a printed circuit board, the method comprising the steps of providing the printed circuit board having a plurality of through-holes therein and including a module on the top surface thereon, the module having a plurality of lead free solder joints, at least one of the plurality of lead free solder joints being located relative to at least one of the plurality of through-holes, extending a thermocouple wire through at least one through-hole, and positioning a first thermocouple within the through-hole, within or proximate the at least one of the plurality of lead free solder joints, and connecting the thermocouple wire to the first thermocouple. The method includes positioning a second thermocouple on the bottom surface proximate the at least one through-hole and connecting the second thermocouple to the thermocouple wire to form a thermocouple pair with first thermocouple, reflowing the plurality of lead free solder joints, cooling the at least one lead free solder joint through a solidification temperature range, and measuring the temperature differential between the top and the bottom surfaces with the first and second thermocouples substantially through the solder joint solidification temperature range.

According to another aspect of the invention there is provided an arrangement for measuring the cooling rate and temperature differential between a top surface and a bottom surface of a printed circuit board comprising a module on the top surface of the printed circuit board, the printed circuit board including a plurality of through-holes therein, the module having a plurality of lead free solder joints, at least one of the lead free solder joints being located relative to at least one of the plurality of through-holes, a thermocouple wire positioned in the at least one through-hole, a first thermocouple positioned within the through-hole, within or proximate the at least one of the plurality of lead free solder joints and connected to the thermocouple wire, and a second thermocouple positioned on the bottom surface proximate the through-hole and connected to the thermocouple wire to form a thermocouple pair with the first thermocouple. The arrangement further includes a heater adapted for reflowing the plurality of lead free solder joints, a cooler adapted for cooling the at least one lead free solder joint through a solidification temperature range, and a device adapted for measuring the temperature differential between the top and the bottom surfaces with the first and second thermocouples substantially through the solidification temperature range.

BRIEF DESCRIPTION OF THE DRAWINGS

Reference may now be had to the following detailed description of a preferred embodiment of the invention, taken in conjunction with the accompanying drawings; in which:

FIG. 2 illustrates diagrammatically a fragment of a printed circuit board or profile card illustrating the thermocoupling of the top and bottom surfaces thereof in order to obtain a thermal profile analysis;

BEST MODE FOR CARRYING OUT THE INVENTION

Figure 1:
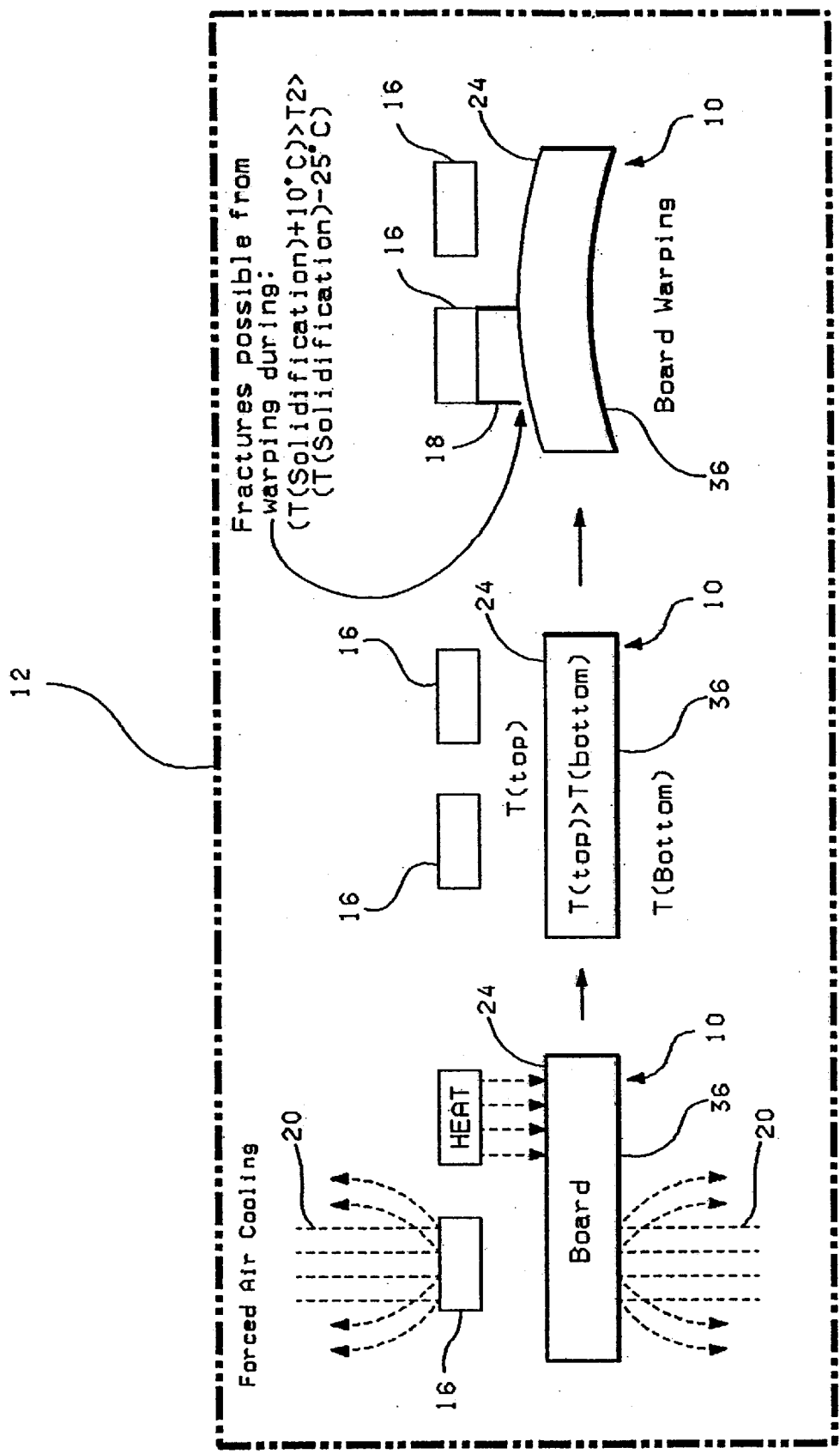
FIG. 1 illustrates, generally diagrammatically, the sequence of potential printed circuit board warpage encountered during a reflow soldering cycle in a soldering oven.

Referring to FIG. 1 of the drawings there is diagrammatically illustrated a printed circuit board 10 which is subjected to heat in a reflow soldering oven 12, or the like, within which it is transported on a conveyor belt system or on a suitable conveyor rail (not shown). Printed circuit board 10 is shown with a top surface 24 thereof equipped with different modules or components 16 such as; for example, CCGA or CBGA modules, which have solder connections 18 provided thereon. Solder connections can be solder joints, for example columns, balls, or fillets. Solder connections may be of the eutectic type or of the high melt type. An example of one high melt solder is a composition of about 90% by weight lead and about 10% by weight tin, referred to as 90/10 solder. Lead free tin-rich solders can also be used in the practice of this invention. Lead free solders can include an element selected from the group consisting of tin, bismuth, indium, silver, antimony, and copper. For example, one solder which can be used in this invention is a lead free solder having about 3.8% silver, about 0.7% to about 0.9% copper, and the remainder tin.

As can be ascertained from the left hand side FIG. 1, printed circuit board 10 is shown in the cooling section of oven 12 in which forced air cooling 20 is imposed on both top and bottom surfaces of PCB 10. As shown, the forced cooling air directed against top surface 24 of PCB 10 is to a considerable extent reflected away by components 16, allowing a greater amount of heat to remain in the top surface. Differences in the volume/rate of airflow on the top and bottom surfaces is also a significant factor in top surface 24 retaining a greater amount of heat.

Consequently, as indicated in the middle portion of FIG. 1, there is encountered a temperature differential ($\Delta T_z$) between top surface 24 of PCB 10 which supports component 16 and bottom surface 36. Resultingly, a higher temperature is present at top surface 24 of printed circuit board 10 which, as shown in the right-hand portion of the drawing, causes the downward warping of the board, and thereby a potential fracture, or potential to fracture during thermal cycling, of at least some of the electrical solder connections 18 between components 16 and top surface 24 of PCB 10, during the time interval when the temperature of the solder is in the range of about (T1+10 degrees Celsius)>T2>(T1− 25 degrees Celsius).

Similarly, there exists other examples of temperature differentials not directly illustrated in FIG. 1. Changes in temperature at board top surface 24 relative to bottom surface 36 can also occur as a result of any imbalance in the heating or cooling mechanisms in the reflow oven, such as may be due to inherent design of the oven (e.g., placement of heating elements, cooling elements, fans, baffles, etc.); or such as may be due to mechanical failure of an oven component such as heating element, cooling element, or fan, etc. Temperature changes relative to the top and bottom surfaces may also be a result of factors involving the assembled board such as placement of components, orientation of the board through the oven, use of fixtures to hold or shield parts of the board during relow, etc. In general, at least four different situations may occur as a result of such temperature differentials between top and bottom board surface:

(a) Positive temperature differential, where temperature of top surface exceeds that of bottom surface, resutlting in downward warping of the board.

(b) Negative temperature differential, where temperature of bottom surface exceeds that of top surface, resulting in upward warping of the board.

(c) Sudden positive change in temperature differential, such as would occur if board changed from a negative $\Delta T_z$ to $\Delta T_z=0$, resulting in bending of the board in the downward direction.

(d) Sudden negative change in temperature differential, such as would occur if board changed from a positive $\Delta T_z$ to $\Delta T_z=0$, resulting in bending of the board in the downward direction.

All of these situations can cause a fracture, or potential to fracture during thermal cycling, or at least some of the electrical solder connections (18) if the resulting warping or bending of the board occurs during the time interval when the temperature of the solder is in the range of about (T1+10 degrees Celsius)>T2>(T1−25 degrees Celsius).

In order to ameliorate the foregoing problems it is important to eliminate any substantial thermal or temperature differential spikes which may be encountered during the cooling period of solder connections 18 while they are in the range of from about (T1+10 degrees Celsius)>T2>(T1−25 degrees Celsius). As shown in FIG. 2 of the drawings, there is shown a thermal profile card, which comprises PCB 10 fully assembled with components or modules 16 (not shown), and with the addition of a pair of thermocouples 38 and 34, and 38' and 34'. A plurality of thermocouple pairs, 38 and 34, is preferably located at or proximate the following points on top surface 24 and bottom surface 36 of board 10: the diagonal solder joints of the component/module and the center solder joint of the component/module. A plurality of thermocouple pairs, 38' and 34', is further preferably located at the following points on the top surface 24 and bottom surface 36 of board 10 in the absence of modules 16 at these locations, the leading edge of the card at 3 points, the trailing edge of the card at 3 points and at the center line of the card at 3 points (between leading and trailing edge).

As shown in the drawing FIG. 2, printed circuit board 10 is modified to serve as a thermal profile card. Each point at a preselected location on PCB 10 has a typical hole 30 drilled therethrough from the bottom to the top for the passage of a thermocouple wire 32. A thermocouple pair includes thermocouple 34 placed at the bottom of hole 30 measuring the temperature on bottom surface 36 of printed circuit board 10, and thermocouple 38 for measuring the temperature at top surface 24 of printed circuit board 10 which correlates with the temperature of component solder connection 18, and is positioned within the hole so as to contact solder connection 18 while being secured within said hole with an epoxy resin.

Similarly, thermocouple 34 which is positioned in close proximity to the bottom of hole 30 may also be secured to bottom surface 36 of board 10 with epoxy resin.

Thermocouple pairs 38' and 34' are positioned on top surface 24 and bottom surface 36 of board 10 at locations not proximate module solder joints 18.

Thereafter, the temperatures of the top and bottom thermocouples, 38 and 34, and 38' and 34', are measured with a measuring device, for example a digital thermometer and/or datalogger, while printed circuit board 10 is conveyed through reflow solder oven 12 as a function of time.

The measured temperatures and calculated temperature differentials are plotted on the same graph as a function of time, whereby the temperature of the solder as measured by thermocouple 38, is equal to the temperature of top surface 24 of printed circuit board 10 at the component corner solder connections 18; whereas the temperatures of top surface 24 minus the temperature of bottom surface 36, as measured by thermocouple 34, is defined as the top to bottom temperature differential. Similar temperature measurements and temperature differential calculations are performed for the additional thermocouple pairs 38' and 34' in order to ascertain a more global view of the card temperature differential.

Figure 3:
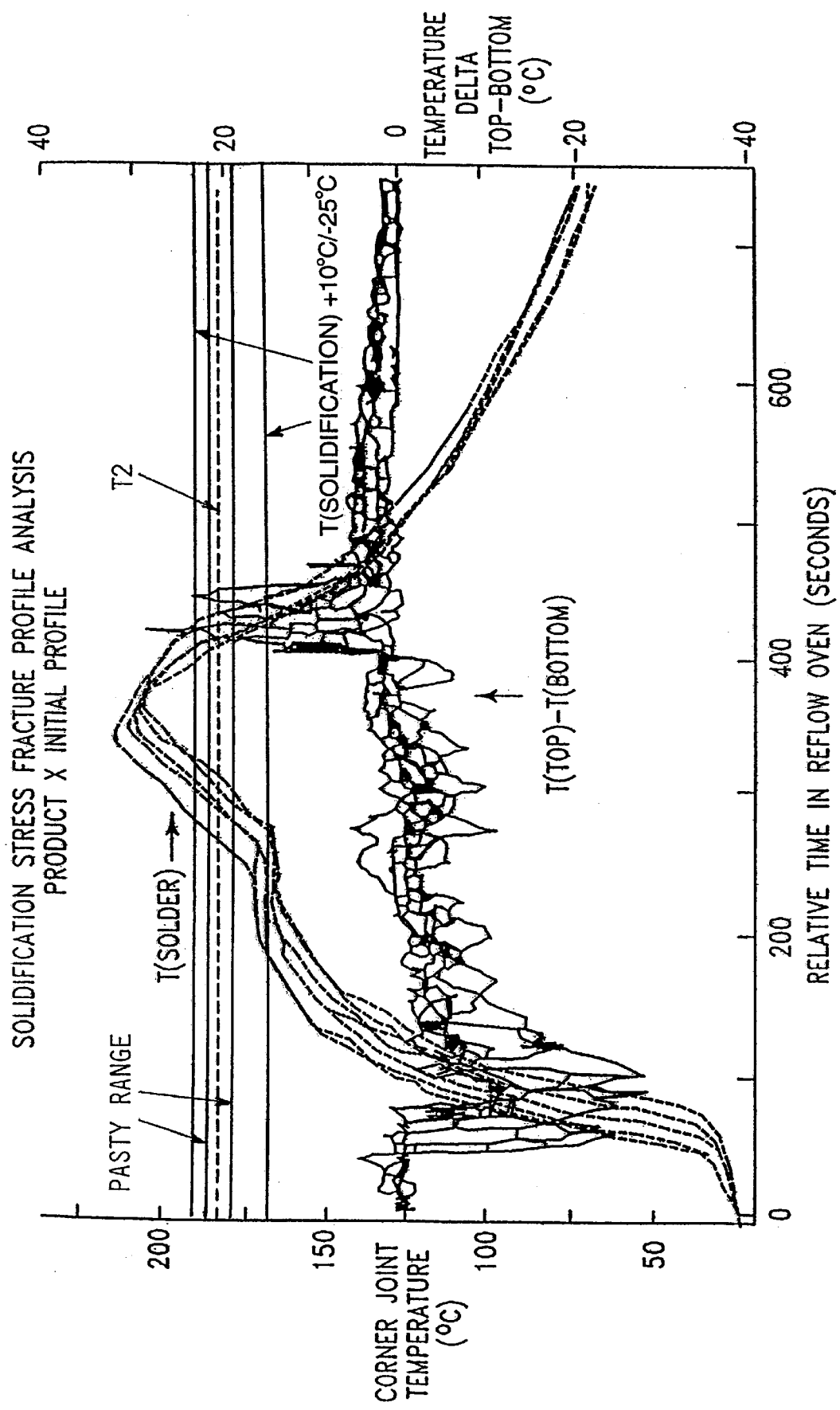
FIG. 3 illustrates a graphical representation of an example of a thermal profile which may result in solder interconnect failures due to solidification fractures.

As shown in FIG. 3, the temperature differentials between a plurality of thermocouple pairs 38 and 34, and 38' and 34', are evaluated with regard to susceptibility to solder fracture failure mode. Thus, a large and sudden decrease (or increase) in the temperature of bottom surface 36 relative to top surface 24 during cooling of component solder connections 18 within the range of about (T1+10 degrees Celsius) >T2>(T1−25 degrees Celsius) indicates a so called "bad" temperature differential spike profile. This high temperature differential, which can cause interconnect failures, or increase the tendency for failures during thermal cycling, of the component solder joints, is clearly illustrated in FIG. 3.

In order to compensate for the foregoing, the oven temperature profile can be adjusted by one or more of the following steps:

(a) Reduce the cooling rate in the reflow solder oven, calculated as the slope temperature T(slope) of the component solder over a period of time, (b) Reduce or eliminate impingement cooling fans, such as forced air cooling, especially at bottom surface 36 of printed circuit board 10 so as to maintain the bottom surface at a somewhat warmer temperature, thereby considerably reducing temperature differential ($\Delta T_z$) with top surface 24. This is accomplished by controlling the temperature around PCB 10 so as to reduce temperature differential ($\Delta T_z$) within the range of about 0° C. to about 12° C., and preferably closer to about 0° C.

(c) In lieu of eliminating impingement fans, balance top/bottom fans so cool down rate is substantially identical (top vs. bottom) at each time (t) at any point (x,y) on PCB 10.

(d) Shielding PCB 10 bottom surface 36 from direct cooling air impingement against any components or modules. This, again, will have a tendency to reduce temperature differentials.

Figure 4:
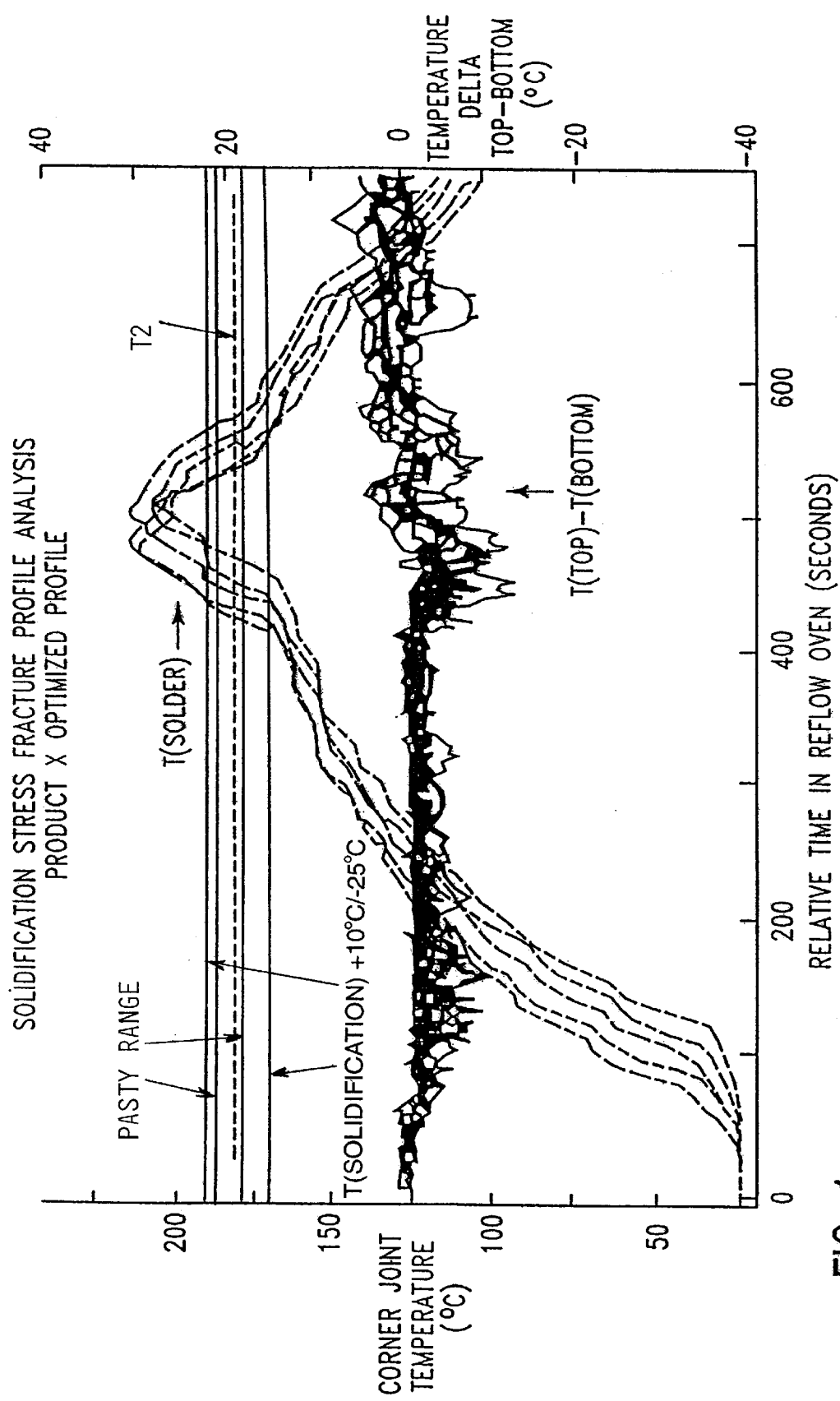
FIG. 4 illustrates a graphical representation similar to FIG. 3, illustrating an example of an improved and optimized thermal profile obtained by the method of the present invention.

The foregoing steps of measuring the plurality of thermocouple temperatures through the printed circuit board conveyance within the reflow oven as a function of time, and calculating and plotting on the same graph, over a function of time, the temperature of the component solder connections at the various corner joints and the temperature of top surface 24 minus the temperature of bottom surface 36, can be repeated, and appropriate oven profile adjustments implemented until no significant top to bottom temperature differential is in evidence during PCB 10 cooling period of the conveyance therethrough. This is clearly illustrated in the optimized temperature profile illustrated in FIG. 4 of the drawings, and which can be employed for the same product or printed circuit board as shown in FIG. 3 of the drawings.

From the foregoing, it becomes readily apparent that through the utilization of the paired thermocouples 38 and 34, and 38' and 34' at top and bottom surfaces 24 and 36, respectively, of printed circuit board 10, and through suitable control of reflow solder oven temperature conditions and the cooling of component solder connections 18, it is possible to avoid undesirable temperature differential spikes which could adversely affect the reliability of the component solder connections 18, inasmuch as there is a significant reduction in any potential warpage of the printed circuit board.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. A method for measuring the cooling rate and temperature differential between a top surface and a bottom surface of a printed circuit board, said method comprising the steps of:
   providing said printed circuit board having a plurality of through-holes therein and including a module on said top surface thereon, said module having a plurality of lead free solder joints, at least one of said plurality of lead free solder joints being located relative to at least one of said plurality of through-holes;
   extending a thermocouple wire through said at least one through-hole;
   positioning a first thermocouple within said at least one through-hole, within or proximate said at least one of said plurality of lead free solder joints and connecting said thermocouple wire to said first thermocouple;
   positioning a second thermocouple on said bottom surface proximate said at least one through-hole and connecting said second thermocouple to said thermocouple wire to form a thermocouple pair with said first thermocouple;
   reflowing said plurality of lead free solder joints;
   cooling said at least one lead free solder joint through a solidification temperature range; and
   measuring said temperature differential between said top and said bottom surfaces with said first and second thermocouples substantially through said solidification temperature range.

2. A method as claimed in claim 1, wherein said plurality of through-holes are provided in said printed circuit board at locations spaced on said top and said bottom surfaces of said printed circuit board.

3. A method as claimed in claim 2, further including the step of forming a plurality of said thermocouple pairs proximate selected ones of said plurality of through-holes to facilitate obtaining said temperature differential between said top and said bottom surfaces.

4. A method as claimed in claim 3, further including operatively connecting each of said thermocouple pairs at respectively each of selected ones of said plurality of through-holes for measuring said temperature differential.

5. A method as claimed in claim 3, further including the step of sensing said temperature differential at selected ones of said plurality of lead free solder joints defined by diagonal solder joints of said module, the middle solder joint of said module, a leading edge of said board at three points, a trailing edge of said board at three points, and the centerline of said board at three points between said leading and said trailing edges.

6. A method as claimed in claim 5, further including the step of controlling said temperature differential sensed by each of said thermocouple pairs so as to maintain said temperature differential between said top and said bottom surfaces of said printed circuit board within a predetermined temperature differential range.

7. A method as claimed in claim 6, further including the step of maintaining said temperature differential range between said top and said bottom surfaces of said printed circuit board within a magnitude of about 0° C. to about 12° C. so as to substantially prevent the occurrence of temperature differential changes during said step of cooling said at least one lead free solder joint through said solidification temperature range.

8. A method as claimed in claim 7, wherein said maintaining step comprises controlling said temperature differential through said solidification temperature range from about (T1+10 degrees Celsius)>T2>(T1−25 degrees Celsius).

9. A method as claimed in claim 1 further including the step of fastening said first and said second thermocouples to said top and said bottom surfaces or within said through-hole with an epoxy resin.

10. An arrangement for measuring the cooling rate and temperature differential between a top surface and a bottom surface of a printed circuit board comprising:
    a module on said top surface of said printed circuit board, said printed circuit board including a plurality of through-holes therein, said module having a plurality of lead free solder joints, at least one of said lead free solder joints being located relative to at least one of said plurality of said through-holes;
    a thermocouple wire positioned in said at least one through-hole;
    a first thermocouple positioned within said at least one through-hole, within or proximate said at least one of said plurality of lead free solder joints and connected to said thermocouple wire;
    a second thermocouple positioned on said bottom surface proximate said through-hole and connected to said thermocouple wire to form a thermocouple pair with said first thermocouple;
    a heater adapted for reflowing said plurality of lead free solder joints;
    a cooler adapted for cooling said at least one lead free solder joint through a solidification temperature range; and
    a device adapted for measuring said temperature differential between said top and said bottom surfaces with said first and second thermocouples substantially through said solidification temperature range.

11. An arrangement as claimed in claim 10, wherein said plurality of through-holes are positioned in said printed circuit board at locations spaced on said top and said bottom surfaces of said printed circuit board.

12. An arrangement as claimed in claim 11 further including a plurality of said thermocouple wires positioned in selected ones of said plurality of through holes.

13. An arrangement as claimed in claim 12 further including a plurality of said first thermocouples on said top surface of said printed circuit board proximate said selected ones of said plurality of through holes, each of said first thermocouples connected to each of said thermocouple wires in selected ones of said plurality of through holes.

14. An arrangement as claimed in claim 13 further including a plurality of said second thermocouples on said bottom surface of said printed circuit board proximate said selected ones of said through holes, each of said second thermocouples connected to each of said thermocouple wires to form a plurality of thermocouple pairs.

15. An arrangement as claimed in claim 14, wherein each of said plurality of thermocouple pairs are operatively connected at respectively each of said selected ones of said plurality of through-holes to measure said temperature differential.

16. An arrangement as claimed in claim 14, wherein said plurality of thermocouple pairs are adapted for measuring said temperature differential at selected ones of said plurality of lead free solder joints defined by diagonal solder joints of said module, the middle solder joint of said module, a leading edge of said board at three points, a trailing edge of said board at three points, and the centerline of said board at three points between said leading and said trailing edges.

17. An arrangement as claimed in claim 10, wherein said heater comprises an oven.

18. An arrangement as claimed in claim 17, wherein said cooler is a cooling section of said oven.

19. An arrangement as claimed in claim 10, wherein said device comprises a digital thermometer and/or a datalogger.

20. An arrangement as claimed in claim 10, wherein said printed circuit board comprises a temperature profile card.

* * * * *